(12) United States Patent
Golez et al.

(10) Patent No.: US 10,770,128 B2
(45) Date of Patent: Sep. 8, 2020

(54) NON VOLATILE MASS STORAGE DEVICE WITH IMPROVED REFRESH ALGORITHM

(71) Applicant: Intel Corporation, Santa Clara, CA (US)

(72) Inventors: Mark Anthony Golez, Folsom, CA (US); David J. Pelster, Longmont, CO (US); Xin Guo, San Jose, CA (US); Paul D. Ruby, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,446

(22) Filed: Sep. 28, 2018

(65) Prior Publication Data
US 2019/0043556 A1 Feb. 7, 2019

(51) Int. Cl.
*G11C 16/06* (2006.01)
*G11C 11/406* (2006.01)
*G11C 16/34* (2006.01)
*G11C 16/08* (2006.01)
*G11C 16/32* (2006.01)
*G11C 13/00* (2006.01)
*G11C 8/12* (2006.01)

(52) U.S. Cl.
CPC ... *G11C 11/40611* (2013.01); *G11C 11/40603* (2013.01); *G11C 11/40618* (2013.01); *G11C 13/0023* (2013.01); *G11C 13/0033* (2013.01); *G11C 13/0061* (2013.01); *G11C 16/08* (2013.01); *G11C 16/32* (2013.01); *G11C 16/349* (2013.01); *G11C 16/3418* (2013.01); *G11C 8/12* (2013.01); *G11C 2211/4063* (2013.01)

(58) Field of Classification Search
CPC ......... G11C 11/40611; G11C 11/40603; G11C 11/40618; G11C 8/12; G11C 2211/4063
USPC ............................................. 365/222, 185.25
See application file for complete search history.

(56) References Cited

U.S. PATENT DOCUMENTS

2015/0193302 A1* 7/2015 Hyun .................... G11C 29/52
714/764

OTHER PUBLICATIONS

Luo, Yixin, "WARM: Improving NAND Flash Memory Lifetime with Write-hotness Aware Retention Management" 2015 IEEE, 14 pages.

* cited by examiner

*Primary Examiner* — Huan Hoang
(74) *Attorney, Agent, or Firm* — Compass IP Law PC

(57) ABSTRACT

A refreshing method is described. The method includes recognizing a set of blocks of a non-volatile memory for refreshing and then refreshing a subset of the data within the blocks, where, invalid data within the blocks is not recognized for refreshing and a group of blocks whose oldest data has not aged for a pre-set time period is not recognized for refreshing.

22 Claims, 5 Drawing Sheets

Refresh_Rate = 0

For all bands:

If age[band] >= Hold_Off_Period

Refresh_Time_Left[band] = (MAX_AGE_ALLOWED – Age[band])

Refresh_Rate += Valid_Data[band]/Refresh_Time_Left[band]

Fig. 4

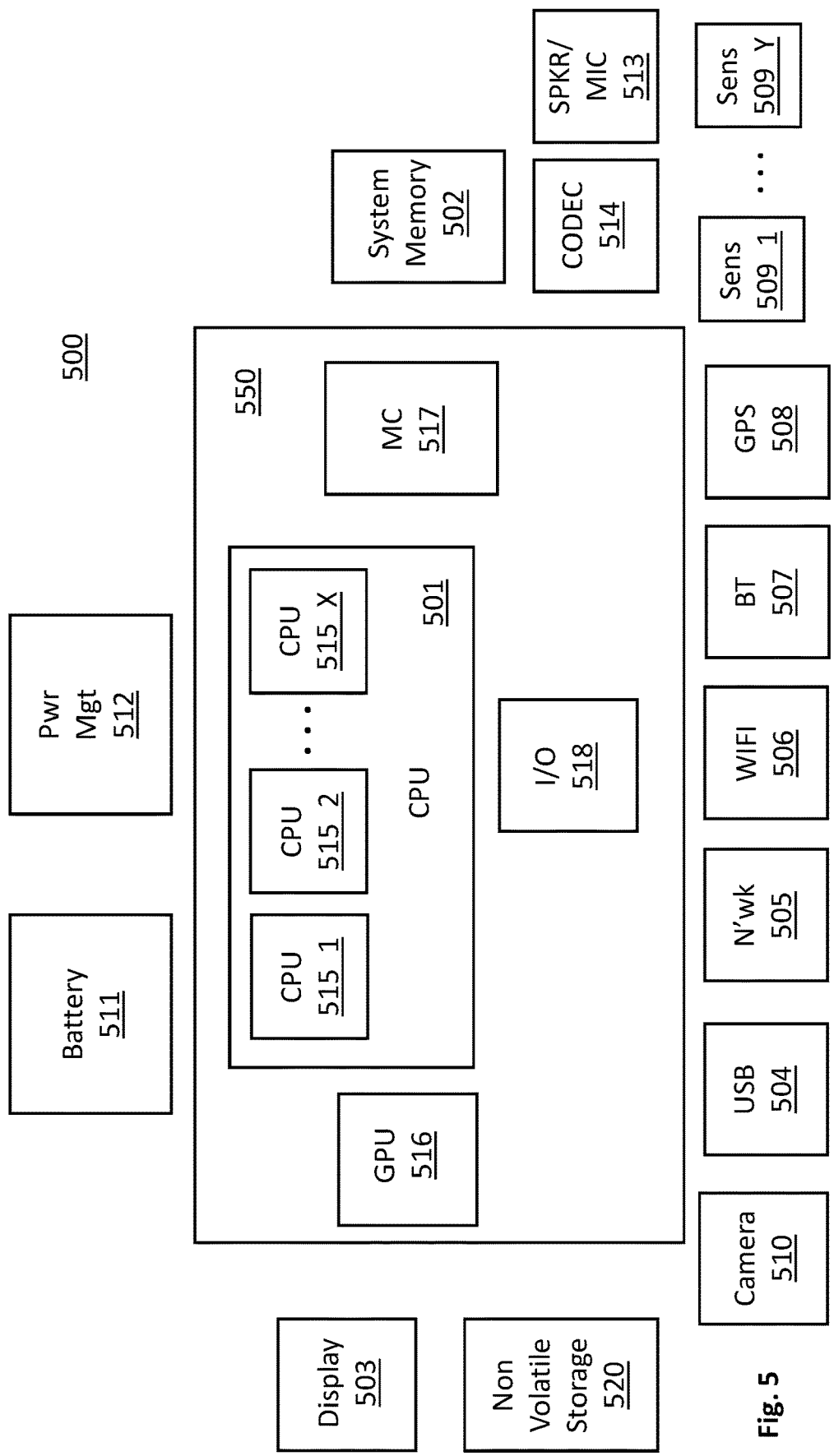

NON VOLATILE MASS STORAGE DEVICE WITH IMPROVED REFRESH ALGORITHM

FIELD OF THE INVENTION

The field of invention pertains generally to the computing sciences and more specifically to a non volatile mass storage device with improved refresh algorithm.

BACKGROUND

With the emergence of centralized computing such as cloud computing and other internet based high end computing implementations, new ways of implementing high performance computing systems are being investigated and pursued. The performance and/or efficiency of the non volatile mass storage used by high performance data centers are especially receiving more focused attention. Additionally, more and more computing systems, whether low end (e.g., smart appliance, smart phone), high end (e.g., server computer) or in-between desire more mass storage to keep large amounts of data and/or software and the ability to read/write information from/to mass storage with reduced access times. As such, generally, the performance of non volatile mass storage devices is receiving increased attention.

A flash memory cell can lose its stored data if the data is stored in the cell for too long a time period. As a consequence, solid state drives typically include a controller to "refresh" the flash storage cells. According to a common approach, before the expiration of a critical time period (e.g., ten days) after which a cell may lose its stored data, data is read from the cell and written elsewhere (to another cell). The writing of the cell's data elsewhere removes any concern that the cell's data will be lost. Subsequently, the cell is eventually written over with new data which starts a new critical time period before which the newly written data must be read and written elsewhere.

A problem with the aforementioned refreshing process is that it is relatively unsophisticated. Specifically, the refresh process periodically reads data from every cell and rewrites each cell's data to another cell within the critical time period according to a fixed time schedule. The refresh process is spread out over time to keep its instantaneous overhead low. Its constant operation, however, nevertheless ensures that the overhead is continuously present.

For example, in a solid state drive (SSD) having N available blocks of storage cells and a critical time period of ten days (a cell can lose information that it stores for more than ten days), the basic background refresh process ("background data refresh" (BDR)) will schedule constant block refreshing activity over time such that all N blocks are refreshed after ten days. That is, simplistically, the SSD will refresh blocks at a rate of N/10 different blocks per day for ten days and then restart the entire refreshing process on the eleventh day. The overhead of the constant background process translates into a permanent loss in the SSD's performance. That is, every day, some number of host accesses will be delayed waiting for refreshing activity to complete. In a specific BDR approach, only "relative" (rather than "actual") ageing of cells is tracked/determined. Here, each newly written band is provided a sequence number when it is opened. A band's age is the difference between a global sequence number for the SSD and the band's specific sequence number. As such, how long the band has actually aged (in real time) is not determined.

FIGURES

A better understanding of the present invention can be obtained from the following detailed description in conjunction with the following drawings, in which:

FIG. 4 shows an embodiment of the refresh function of FIG. 2;

FIG. 5 shows a computing system.

DETAILED DESCRIPTION

A solution is a more sophisticated refreshing algorithm that attempts to better reduce the overhead cost of the refreshing process.

Figure 1:
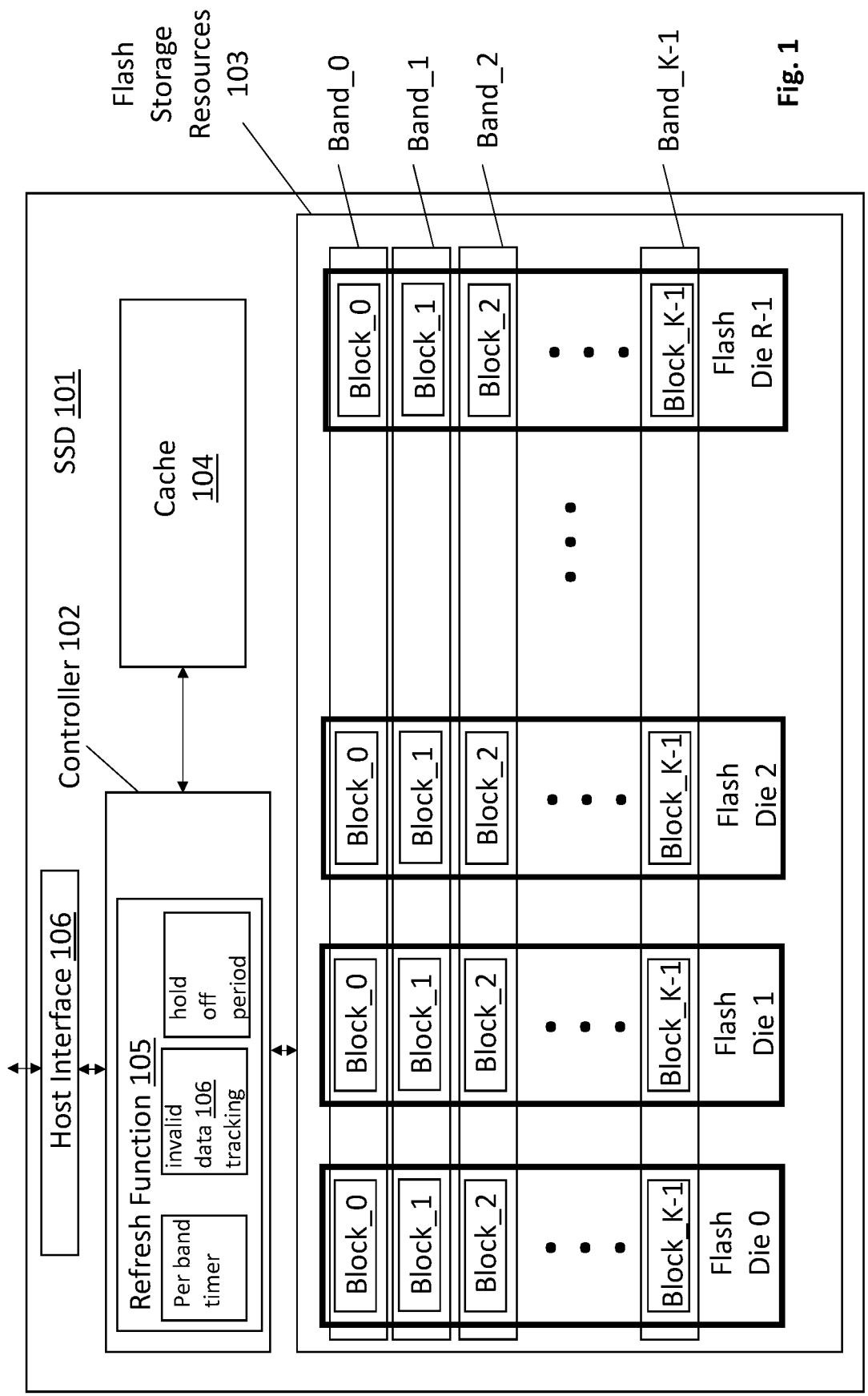
FIG. 1 shows a solid state drive having a controller that executes an improved refresh function.

FIG. 1 shows an improved SSD 101 that utilizes an improved refreshing algorithm. As observed in FIG. 1, the flash storage resources 103 of the SSD can be viewed as including multiple (R) flash die, where, each flash die includes a number K of separately writable blocks of flash storage cells. Here, a same positioned block across the R die corresponds to a "band" of flash blocks/cells. Thus, as there are K separately writable blocks per die and R flash dies per SSD, each band represents R storage blocks. A block is the basic physical unit at which data is erased, and thus the unit of physical reclaim storage. Writes are programmed at page granularity and reads are accessed at some smaller access size typically maintained as a correctable code word of data.

Importantly, the SSD 101 includes a transfer buffer 104 composed, e.g., of static random access memory (SRAM). The transfer buffer 104 generally has lower access times than the flash memory devices. Host read/write accesses are handled from the transfer buffer 104 when possible so that the host observes SRAM like speed from the SSD 101 rather than flash like speed (particularly for writes, because writes to flash are generally much slower than reads from flash). The size of the transfer buffer 104, however, is only a fraction of the total combined capacity of the flash memory devices 103 so that, generally, only some percentage of host accesses can be handled from the transfer buffer.

When the transfer buffer 104 is used to handle a host write, the data from the host is written directly to the transfer buffer 104 rather than to a flash memory 103 (the data is eventually "written" from the transfer buffer 104 to a flash memory). In this case, the controller 102 marks any previous copies of the data that currently reside in flash memory as "invalid". The controller is then free to write the new data elsewhere in flash memory 103 (e.g., a presently erased block). In this case, the controller changes the mapping of the data's logical block address (LBA) to point to the new location in flash memory 103 where it is stored rather than the prior, newly invalidated location where it was stored.

In various embodiments, data validity/invalidity tracking is handled/managed at a granularity that is less than a block. For example, invalidity/validity tracking may be performed at page granularity. Here, multiple pages can be stored in a single block of flash memory. In still other embodiments, invalidity/validity tracking of data is performed at a granularity that is less than a page (e.g., at sections of a page). In still yet other embodiments, data/invalidity tracking is handled/managed at block granularity. LBAs may also be assigned at page granularity or less than page granularity (e.g., by the host, by the SSD or both).

As such, according to one aspect of an improved refresh process, the meta-data that the controller 102 keeps as to which units of data are invalid 106 is used by the refresh process to reduce the refresh burden. Here, the controller 102 maintains a list or map 106 that identifies which units of data in which flash die are invalid (or contra-wise, which data units are valid). The controller 102 calculates what percentage of a data within a group of blocks is valid and then calculates a refresh rate for the group of blocks based on its valid data. That is, the controller removes the group of blocks' invalid data from consideration for refreshing (there is no need to refresh invalid data). Removing invalid data from consideration from refreshing reduces the amount of data that is scheduled for refreshing which, in turn, lessens the burden/overhead of the refreshing process.

Figure 2:
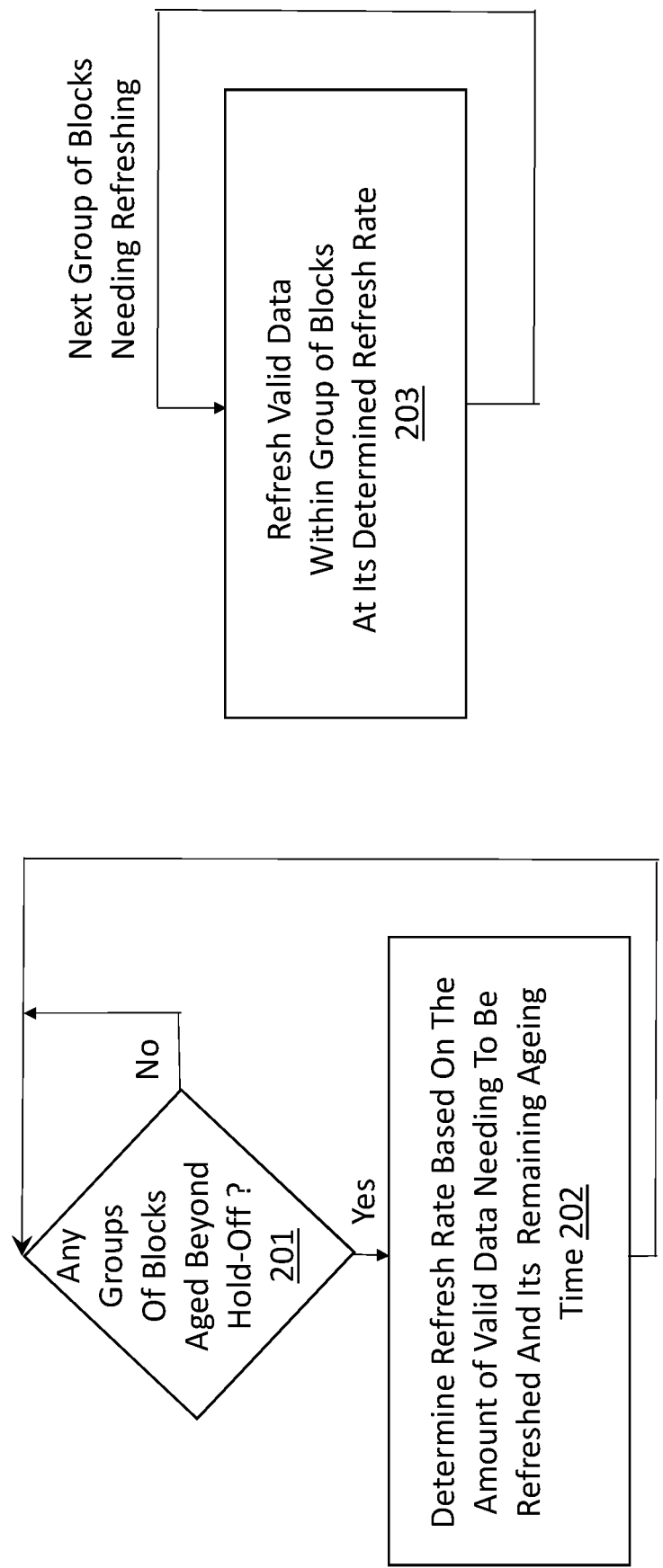
FIG. 2 shows an embodiment of the refresh function.

FIG. 2 shows an embodiment of a refresh process which may be performed by the controller 102 of the SSD 101 of FIG. 1. As observed in FIG. 2, a refresh rate is determined 202 for a group of blocks based on a recognized amount of valid data within the group and the amount of time that remains before any of the valid data within the group may become lost (remaining ageing time). Then, only the valid data within the group of blocks begins to be refreshed at the newly determined refresh rate 203. The process then repeats. According to one embodiment, a "hold-off" period is implemented 201 whereby a group of blocks' oldest data must age for a sufficient amount of time (the "hold-off" time) before a refresh rate calculation is made for the group of blocks.

In various embodiments, blocks are logically grouped together and considered for refresh treatment as a whole. For example, blocks in a same band are grouped together for same refresh treatment (e.g., a decision is made to refresh an entire band which causes all blocks in the band to subsequently be refreshed). As it may take time to "fill-up" an entire band with new write data, whether or not a band's data has sufficiently aged to warrant refreshing of the band is determined from the time the band was first written to with new data after it was refreshed. That is, the refresh process ensures that the band's oldest data is refreshed before any data is lost even though other data in the band (the band's most recently written data) is not in any danger of being lost.

As observed in FIG. 2, the refresh process groups flash memory blocks together and uses meta data that is maintained on the data within the group to determine appropriate refresh treatment of the group. For the sake of example the ensuing discussion will assume blocks are grouped together at band granularity even though other block groupings are possible (e.g., band pairs, groups of blocks in a same die, groups of blocks across a set of die other than all die, "half band" groupings, etc.).

Here, as writing activity to the SSD transpires over time, the state of the content within the SSD's bands change (some bands are refreshed, others have data that ages). Thus, over time, which bands have data that has sufficiently aged to trigger a refresh rate calculation 201, the amount of time remaining before any ageing data within a band is lost, and/or, the amount of valid data within a band is apt to change. As such, the determined refresh rate for any particular band and the number of bands that are scheduled for refresh at their determined refresh rate will vary over time.

According to various embodiments, a timer is started after a "clean" band is first written to with new data ("initial write data"). The start of the timer marks the beginning of a new time period for the band. The end of this time period corresponds to the maximum amount of time the band can keep its initial write data before the initial write data needs to be refreshed (e.g., ten days).

Importantly, as alluded to above, refreshing is deliberately held off (not performed) on the band for a pre-determined amount of time, referred to as the hold-off time 201. As such, immediately after a clean band has been written to with its initial write data, the band is not recognized as needing refreshing and a refresh rate calculation for the band is not performed.

After the band's timer reaches a count that reaches the hold-off time 201 (e.g., after three days have expired), a refresh rate calculation 202 and refreshing activity 203 for the band is triggered. With respect to the refresh rate calculation 202, the controller 102 determines how much of the band's data is valid. Here, with the controller 102 tracking which data units (e.g., pages, sections of pages, etc.) within the band are valid, it is straight-forward for the controller to determine how much of the band's data is valid (the controller 102 scrolls through its meta-data for the data units within the band and tabulates a running total of how much data in the band is valid).

The controller 102 also determines how much time is left before the band's timer expires (that is, how much time is left before the band might begin to lose its oldest, initially written data). In general, this amount of time corresponds to the maximum permitted size of the time window marked by the timer (the amount of time between when the timer started and when the timer expires) less the hold-off period. The controller 102 then determines a refresh rate 202 that incorporates the amount of data that is presently valid in the band and the amount of time remaining before the band's timer expires.

As described in more detail below, in an embodiment, the refresh rate calculation 202 also takes into account the scheduled "load" of all bands that are currently being refreshed (e.g., have aged beyond their hold-off period but have not yet completed their refreshing activity). That is, the controller sets the refresh rate for the SSD based on all groups of data (e.g., across all bands) that have exceeded their hold-off and the amount of time remaining before such data is in danger of being lost. For example, the refresh calculation 202 determines a separate rate for each band that have aged beyond the hold off that is the amount of valid data within the band normalized by the remaining aging time for the band. The refresh rate calculation 202 then adds these rates to determine the refresh rate of the SSD.

After the refresh rate has been calculated 202, the band is scheduled for refreshing 203. During refreshing, blocks of data within the band that contain valid data are accessed (read from flash memory), e.g., in succession according to the calculated refresh rate for the band, and any/all valid data within such blocks are written to other blocks within the SSD (the controller updates the meta-data that is tracked for the units of re-written data to reflect their new LBA). Blocks that do not contain any valid data within the band need not be accessed at all during the refresh process. According to an embodiment, as observed in FIG. 2, bands are refreshed 203 in succession such that a next band cannot be refreshed until the band that is currently being refreshed is completely refreshed.

As alluded to above, when determining the refresh rate 202 for a particular band, the controller 202 also considers the refresh "load" of all bands whose data has aged beyond its hold off period.

Figure 3:
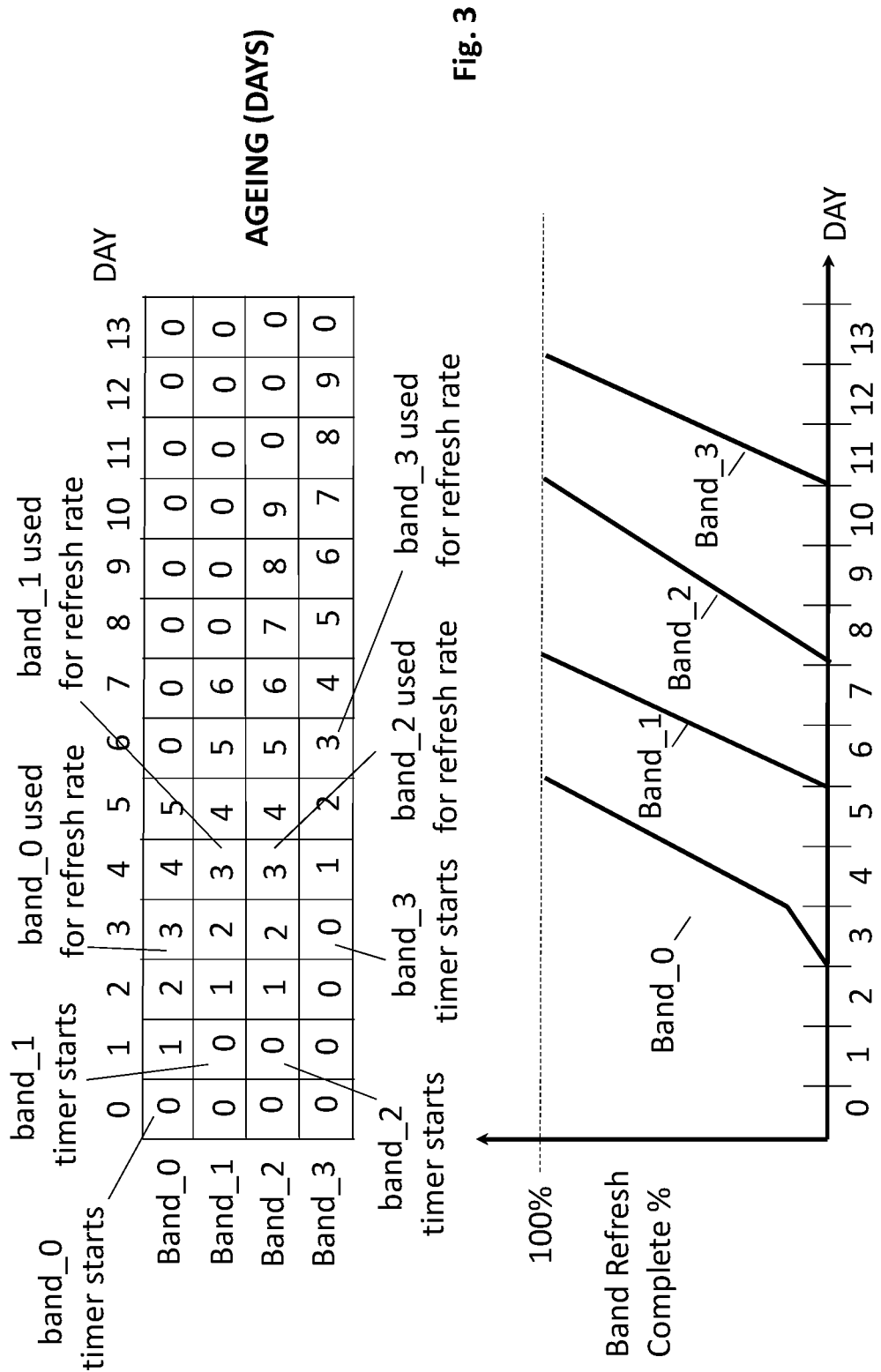
FIG. 3 shows an example of the refresh function's execution.

FIG. 3 shows an example. According to the example of FIG. 3, an SSD having four bands is turned on for the first time at day 0. On initial day 0 the host system only writes to band 0. Here, the SSD is designed to fill-up a band before writing to a next band. As such, over the first day (day 0), only band 0 has its timer started and no other bands are in consideration for refreshing (they have not yet received their initial write data as of the end of day 2). The timer expires when its count reaches the tenth day and thus is set to expire on day 10.

Assuming a three day hold off period, refresh is not considered for band 0 until after day 2 has concluded, at which point, the controller 102 determines the amount of time left on the timer (10 days−3 day hold off=7 days) and determines a refresh rate of X/7 where X is the amount of valid data in band 0. Over the course of day 3, a background refresh is performed at a rate of X/7 refreshes per day. Note that X is the valid data in band 0. Thus, if significant amounts of data in band 0 were, e.g., written-to twice through day 2 and therefore invalidated by day 3 (a likely occurrence in many SSDs), X may be a reduced number (as compared to the total capacity of the band) which, in turn, translates into a reduced refresh rate and corresponding refresh overhead.

On day 1 the host not only "fills-up" band 0 (all pages of all blocks in band 0 have been written to at least once by the end of day 1), but also, the host "fills-up" band 1 and starts writing to band 2. Thus, both band 1 and band 2 have their timers started on day 1. However, because bands 1 and 2 are within their respective hold off periods, they are not considered for the refresh rate calculation at the conclusion of day 2 (only band 0's is, as described above). As such, FIG. 3 depicts a reduced refresh rate for band 0 on day 3 because only band 0's valid data is incorporated into the refresh calculation.

However, as of the conclusion of day 3, bands 1 and 2 have surpassed their hold off periods and, as such, their combined valid data and the remaining time on their timers enter the refresh rate calculation 202. In one approach, separate refresh rates are considered for all three bands. For the sake of simplicity, band 0's refresh rate is assumed to remain at X/7. That is, for band 0, at the conclusion of day 3, there is X−X/7=6X/7 valid data remaining to be refreshed and 6 days remaining before it must be refreshed. As such, the refresh rate calculation for band 0 at the conclusion of day 3 remains at X/7 (((6X/7)/6)=X/7).

Note that in actuality the amount of valid data in band 0 at the conclusion of day 3 may depart from the assumed value above of 6X/7, in which case, the refresh rate calculation for band 0 will depart from the specific calculation above. For example, if the rate at which data in band 0 was invalidated over the course of day 3 significantly exceeded the rate that was demonstrated over days 0 through 2, then the amount of valid data remaining in band 0 at the conclusion of day 3 would be noticeably less than 6X/7 (e.g., X−X/4=3X/4). Correspondingly, the refresh rate calculation for band 0 would also yield a rate that is significantly less than X/7 (e.g., (3X/4)/6=X/8). The remainder of the discussion, for simplicity, assumes the amount of valid data in band 0 at the conclusion of day 3 is 6X/7 resulting in a refresh rate calculation for band 0 at the conclusion of day 3 of X/7.

The refresh rate for band 1 at the end of day 3 is Y/7 (band 1 has Y valid data remaining at the end of day 3). The refresh rate for band 2 at the end of day 3 is Z/7 (band 2 has Z valid data remaining at the end of day 3). The combined rate for all three bands as determined 201 by the controller 102 is therefore (X+Y+Z)/7. The controller 102 therefore, on day 4, "speeds-up" the refresh activity of band 0 at the combined, accelerated refresh rate. Here, the faster refresh rate on day 4 accounts for the fact that the data in all three bands (band_0, band_1 and band_2) are now aging beyond their hold off periods and need to be refreshed before the expiration of their respective timers. In essence, even though band_0's timer expires at distant day 10, both band_1's and band_2's respective timers expire on day 11. In order to leave a sufficient amount of time to refresh band_1 and band_2 before day 11, the controller "speeds-up" the refreshing of band_0 on day 4.

As such, FIG. 3 shows a noticeable increase in the refresh rate of band 0 on day 4. The accelerated refresh rate causes band 0 to be completely refreshed by the conclusion of day 5 well before its timer expiration on day 10. For ease of discussion, it is assumed band_0 is never written to again after its refresh. As such a timer restart for band_0 never occurs and band_0 does not contribute to any further refresh rate calculations. If (as is likely in a real system), band_0 was written to again after its refresh, the timer would restart for band_0 and the valid block count of band_0 would contribute to the refresh rate calculation when the restarted timer reaches a count of 3 days (the hold off period).

With band_0 being refreshed at the conclusion of day 5, on day 6, the controller 102 takes steps to begin refreshing band 1 and determines another refresh rate that does not include band_0's state. Notably, however, band_3 was first written to on day 3 and its hold off period expires at the conclusion of day 5. Thus, on day 6, the refresh calculations omit any calculations for band_0 but introduce calculations for band_3. Assuming for the sake of simplicity that band_3 also has X valid data at the conclusion of day 5, the combined refresh rate of bands 1, 2 and 3 will remain unchanged at (X+Y+Z)/7.

Thus, over the course of day 6, band_1 is refreshed at the accelerated refresh rate of (X+Y+Z)/7. As depicted, for illustrative ease, Y is approximately equal to X such that band 1 completes its refresh activity in two days (as did band_0) at the completion of day 7. Thus band_1 is also refreshed well before its timer expiration (at day 11). As with band_0, band_1 is assumed to not be written to again after its refresh and therefore, subsequently, does not have any recognized ageing data and makes no further contributions to any refresh rate calculations.

At the conclusion of day 7, the controller 102 takes steps to refresh band 2. As of day 8, only two bands contribute to the refresh calculations (bands 2 and 3). At the conclusion of day 7 assume that band 2's rate calculation remains at Z/7 and that band 3's rate calculation remains at X/7. As such, the medium refresh rate of (X+Z)/7 is applied to the refresh of band 2 on day 8. Here, the refresh rate is greater than that needed for band 2 alone because band 3's data is ageing beyond the hold-off period and therefore contributes to the refresh rate calculation. By contrast, neither band 0's data nor band 1's data is ageing and therefore neither of these bands contribute to the refresh rate calculation.

Again for the sake of simplicity assume that X, Y and Z are all approximately equal such that band_2 is completely refreshed in three days time at the medium refresh rate rather than two days time as with band_1 at the maximum accelerated refresh rate. Nevertheless, band 2's refresh completion (at the conclusion of day 10), leaves sufficient time for band 2 to complete its refresh before the expiration of band 2's timer on day 11. Again assume that band_2 is never written to again after its refresh and does not contribute to any further refresh rate calculations.

Thus, at the conclusion of day 10, the controller moves toward refreshing band_3 on day 11 and need only consider band_3 for its next refresh rate calculation. As of day 11, band_3 has Z valid data and its time will expire in two days on day 13. As such, the controller will determine a somewhat accelerated refresh rate of Z/2 to ensure that all Z valid data of band_3 is refreshed by the conclusion of day 12.

In review then, note that the ageing/timer for all four bands never reaches or exceeds its expiration of 10 days.

The above example was centered on refreshing all valid data in a band prior to refreshing a next band. In an alternate embodiment, refresh rate calculations are made for each eligible band as described above and then refreshes are concurrently applied to each band (e.g., on a same day). In this case, refresh rates are reduced for each band (e.g., X/7 for band_0, Y/7 for band_1, Z/7 for band_3) but applied to each band over their full remaining time period after the hold off period (e.g., seven days). Thus, the lower graph of FIG. 3 would instead show reduced sloped refresh lines that overlap in time (band_0's line extends from day 3 to day 9; band_1's line extends from day 4 to day 10; band_2's line extends from day 4 to day 10 and band_3's line extends from day 6 to day 12). Note that the refresh activity need not be strictly linear as depicted in FIG. 3 (linear refreshing activity was chosen for illustrative ease).

The hold-off period provides the host with full SSD performance, particularly after the SSD is first used (as observed in the lower graph of FIG. 3, there are little/no delays of host accesses owing to refresh interference at least through day 3). Moreover, as discussed above, over the course of the hold-off period, some percentage (often a considerable percentage) of a band's data is not valid (e.g. it has been written to more than once and the most recent content is already stored elsewhere in the SSD) and can be eliminated from consideration for refreshing, which, in turn, reduces the overhead of the refresh activity as a whole within the SSD. That is, the hold-off period provides a time period over which the data that actually needs to be refreshed (the valid data) can be determined as opposed to simply basing the refresh rate on the total storage capacity of an entire band. The former results in reduced refresh activity (reduced overall refresh rate) but no data loss.

Note that in various embodiments the timer values and other configuration information of the refresh algorithm (e.g., set hold-off period, maximum time window before data loss begins, data ageing count for each band may be persisted, e.g., into the non volatile flash memory resources 103 upon the SSD being powered down). Here, with power being removed from the SSD, the non volatile memory resources 103 retain their data but also do not age (the removal of supply voltage essentially eliminates the aging affect). Thus, when the SSD is subsequently powered up, the persisted data is referred to and the refresh algorithm returns to the same state that existed at the earlier power down and continues operation from that state (e.g., as if the SSD was never powered down).

FIG. 4 shows a particular implementation (in pseudo-code) of the refresh process of FIG. 2. Here, considering all bands in the SSD, for any band in the SSD whose ageing has exceeded the hold-off period, the amount of time left in which the band must be refreshed before it begins to lose data is calculated (Refresh_Time_Left[band]=(MAX_AGE_ALLOWED−Age[band]), where, MAX_AGE_ALLOWED is the maximum amount of power on time that data can age before it may be lost and Age[band] is the amount of time that the oldest data in the band has aged). After the amount of remaining time has been calculated for each band that has aged beyond the hold-off period, the refresh rate for each such band is calculated (Valid_Data[band]/Refresh_Time_Left[band] where Valid_Data[band] is the amount of valid data in the band). Each of the calculated refresh rates are then summed to obtain the refresh rate of the SSD (Refresh_Rate).

Referring back to FIG. 1, the controller 102 may be implemented with various kinds of logic circuitry such as dedicated, custom hardwired circuitry (e.g., application specific integrated circuit (ASIC) logic circuitry), programmable logic circuitry (e.g., field programmable gate array (FPGA)) logic circuitry, logic circuitry designed to execute some kind of program code (e.g., processing core, a microcontroller core, etc.) or any combination therefore. Thus, the functionality of the refresh algorithm 105 itself may be implemented as logic circuitry designed or programmed to perform refresh functionality, or as firmware and/or software that is executed by the controller logic circuitry, or other processor (e.g., a processing core dedicated to a single SSD, multiple SSDs, etc.) to perform refresh functionality, or any combination thereof.

The host interface 106 may be logic circuitry for implementing one or more host communication protocols or other interfacing technology. Examples include peripheral component interconnect express (PCIe), Fiber Channel, Serial AT Attachment (SATA), NVM Express (NVMe) as well as point-to-point link or network interfaces (e.g., Universal Serial Bus (USB), Ethernet, etc.). More than one such interconnect/protocol may be implemented in the interface 106 (e.g., SATA or NVMe over Ethernet or PCIe). Finally, the solid state drive is not restricted to any particular kind of packaging solution (e.g., a USB stick) and can take on many different kinds of physical implementations (e.g., storage blade, a storage sled, a standalone storage peripheral, etc.).

The controller 102 may also implement the refreshing algorithm where certain key parameters are variable and can be programmed into register space of the controller or in non volatile memory space of the SSD. For example, the hold off period (e.g., 3 days) and the timer expiration (e.g., 10 days) may be programmed into the SSD as programmable parameters so that the controller 102 can implement a wide array of possible refresh algorithms in terms of hold-off period and expiration time.

The non volatile memory resources 103 may also be implemented with an emerging non volatile memory rather than or in combination with flash memory. Possible technologies for include phase change based memory, memory devices having storage cells composed of chalcogenide, a ferro-electric based memory (e.g., FRAM), a magnetic based memory (e.g., MRAM), a spin transfer torque based memory (e.g., STT-RAM), a resistor based memory (e.g., ReRAM), an Memristor based memory, universal memory, Ge2Sb2Te5 memory, programmable metallization cell memory, amorphous cell memory, Ovshinsky memory, "3D Xpoint" or "Optane" memory from Intel, Corp., etc. Emerging non volatile memory technology may also manufacture a storage cell array as a three dimensional storage cell array, e.g., in the metallurgy above the semiconductor chip substrate, rather than as a two dimensional array where the storage cells are embedded in the surface of the semiconductor chip substrate. Storage cells in the three dimensional storage cell array may also be accessed according to a cross-point physical access mechanism (e.g., a targeted cell resides between a pair of orthogonally oriented access wires in the chip's metallurgy).

FIG. 5 provides an exemplary depiction of a computing system 500 (e.g., a smartphone, a tablet computer, a laptop computer, a desktop computer, a server computer, etc.). As observed in FIG. 5, the basic computing system 500 may include a central processing unit 501 (which may include, e.g., a plurality of general purpose processing cores 515_1 through 515_X) and a main memory controller 517 disposed on a multi-core processor or applications processor, system memory 502, a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_Y, one or more cameras 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing unit 516 typically executes graphics intensive functions to, e.g., generate graphics information that is presented on the display 503. The memory control function 517 interfaces with the system memory 502 to write/read data to/from system memory 502. Here, the memory control function may be implemented with a switching layer that stands between a memory controller and one or more CPUs (including being coupled to a second network that the one or more CPUs are coupled to).

The power management control unit 512 generally controls the power consumption of the system 500. Each of the touchscreen display 503, the communication interfaces 504-407, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The computing system also includes non-volatile storage 520 which may be the mass storage component of the system.

The computing system may include a storage device, such as a non volatile mass storage device (e.g., an SSD) that implements a refreshing algorithm as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a controller to implement a non-volatile memory refresh algorithm, the controller comprising logic circuitry to recognize a set of blocks of the non-volatile memory for refreshing and then refresh only a subset of data stored within the set of blocks, where, invalid data is not recognized for refreshing and a group of blocks whose oldest data has not aged for a pre-set time period is not recognized for refreshing.

2. The apparatus of claim 1 wherein blocks of a same band are grouped together for recognition of refreshing and wherein valid data of the blocks within the same band are refreshed over time as a unit.

3. The apparatus of claim 2 wherein a next band's blocks do not begin to be refreshed until a previous band's blocks have been fully refreshed.

4. The apparatus of claim 1 wherein data invalidity/validity is tracked at a granularity that is less than or equal to a block.

5. The apparatus of claim 1 wherein the pre-set time period is programmable.

6. The apparatus of claim 1 wherein the non-volatile memory refresh algorithm determines a refresh rate as an amount of valid data recognized for refresh normalized by an expiration time less the pre-set time period.

7. The apparatus of claim 6 wherein the non-volatile memory refresh algorithm determines respective refresh rates for multiple bands having blocks recognized for refresh and combines the respective refresh rates to determine a refresh rate to be applied to a particular one of the multiple bands.

8. The apparatus of claim 1 wherein the controller is to persist, as part of a power down process of a non-volatile mass storage device, any of:
a hold-off period;
a maximum permitted time window without refresh; and,
timer values for different groups of blocks.

9. The apparatus of claim 1 wherein more than one group of blocks whose ageing is tracked as a single unit are concurrently refreshed.

10. A computing system, comprising:
a plurality of processing cores;
a system memory;
a memory controller disposed between the system memory and the plurality of processing cores;
a peripheral controller coupled to the memory controller;
a non volatile mass storage device comprising a controller to implement a non-volatile memory refresh algorithm, the controller comprising logic circuitry to recognize a set of blocks of the non-volatile memory for refreshing and then refresh only a subset of data stored within the set of blocks, where, invalid data is not recognized for refreshing and a group of blocks whose oldest data has not aged for a pre-set time period is not recognized for refreshing.

11. The computing system of claim 10 wherein blocks of a same band are grouped together for recognition of refreshing and wherein valid data of the blocks within the same band are refreshed over time as a unit.

12. The computing system of claim 11 wherein a next band's blocks do not begin to be refreshed until a previous band's blocks have been fully refreshed.

13. The computing system of claim 10 wherein data invalidity/validity is tracked at a granularity that is less than or equal to a block.

14. The computing system of claim 10 wherein the pre-set time period is programmable.

15. The computing system of claim 10 wherein the non-volatile memory refresh algorithm determines a refresh rate as an amount of valid data recognized for refresh normalized by an expiration time less the pre-set time period.

16. A machine readable medium having stored thereon instructions that when processed by a processor causes a refresh method to be performed, the refresh method comprising:
recognizing a set of blocks of a non-volatile memory for refreshing and then refreshing a subset of data within the set of blocks, where, invalid data within the set of blocks is not recognized for refreshing and a group of blocks whose oldest data has not aged for a pre-set time period is not recognized for refreshing.

17. The machine readable medium of claim 16 further comprising grouping blocks of a same band together for recognition of refreshing and refreshing valid data within the blocks of the same band over time as a unit.

18. The machine readable medium of claim 17 further comprising not beginning to refresh a next band's blocks until a previous band's blocks have been fully refreshed.

19. The machine readable medium of claim 16 wherein the method further comprises persisting, as part of a power down process of a non-volatile mass storage device, any of:
a hold-off period;
a maximum permitted time window without refresh; and,
timer values for different groups of blocks.

20. The machine readable medium of claim 16 wherein the pre-set time period is programmable.

21. The machine readable medium of claim 16 wherein the method further comprises determining a refresh rate as a number of blocks recognized for refresh normalized by an expiration time less the pre-set time period.

22. The machine readable medium of claim 16 wherein more than one group of blocks whose ageing is tracked as a single unit are concurrently refreshed.

* * * * *